United States Patent
Lee et al.

(10) Patent No.: US 7,667,144 B2
(45) Date of Patent: Feb. 23, 2010

(54) CIRCUIT BOARD AND METHOD OF FABRICATING THE SAME

(75) Inventors: Shao-Chien Lee, Taoyuan County (TW); Chih-Ming Chang, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 39 days.

(21) Appl. No.: 11/854,343

(22) Filed: Sep. 12, 2007

(65) Prior Publication Data
US 2008/0277141 A1 Nov. 13, 2008

(30) Foreign Application Priority Data
May 8, 2007 (TW) ............... 96116274 A (51) Int. Cl.
*H01R 12/04* (2006.01)
*H05K 1/11* (2006.01)
(52) U.S. Cl. .................. 174/267; 174/260
(58) Field of Classification Search .......... 174/260, 174/261, 267
See application file for complete search history.

(56) References Cited

U.S. PATENT DOCUMENTS

| 6,028,357 | A  | * | 2/2000 | Moriyama | 257/737 |
| 6,413,849 | B1 | * | 7/2002 | Yeoh et al. | 438/612 |
| 6,700,079 | B2 | * | 3/2004 | Bogursky et al. | 174/268 |
| 7,068,520 | B2 | * | 6/2006 | Miyamoto et al. | 361/774 |

* cited by examiner

*Primary Examiner*—Ishwarbhai B Patel
(74) *Attorney, Agent, or Firm*—J.C. Patents (57) ABSTRACT

A circuit board including a dielectric layer, a circuit layer, at least one conductive joint column, and a solder mask layer is provided. The circuit layer having at least one pad is in contact with the dielectric layer. The conductive joint column is disposed on the pad. The solder mask layer is disposed on the dielectric layer and covers the circuit layer. The solder mask layer is in contact with the conductive joint column, and the conductive joint column penetrates the solder mask layer. A height of the conductive joint column is larger than a thickness of the solder mask layer. The enhanced reliability of bonding between another component and the conductive joint column will be provided. Further, a method of fabricating a circuit board is also provided.

6 Claims, 7 Drawing Sheets

CIRCUIT BOARD AND METHOD OF FABRICATING THE SAME

CROSS-REFERENCE TO RELATED APPLICATION

This application claims the priority benefit of Taiwan application serial no. 96116274, filed May 8, 2007. All disclosure of the Taiwan application is incorporated herein by reference.

BACKGROUND OF THE INVENTION

1. Field of the Invention

The present invention relates to a circuit board and a method of fabricating the same. In particular, the present invention relates to a circuit board having a conductive joint column and a method of fabricating the same.

2. Description of Related Art

Generally speaking, a conventional circuit board for carrying and electrically connecting a plurality of electronic devices is mainly composed of a plurality of circuit layers and a plurality of dielectric layers alternately stacked. Each circuit layer is formed by defining a copper foil in a patterning process. Each dielectric layer is disposed between the adjacent circuit layers for isolating the circuit layers. In addition, the stacked circuit layers are electrically connected to each other through conductive vias. Moreover, various electronic devices (for example, active or passive devices) may be further disposed on a surface of the circuit board, and electrical signal propagation among those electronic devices is achieved by internal circuits of the circuit board.

Figure 1:
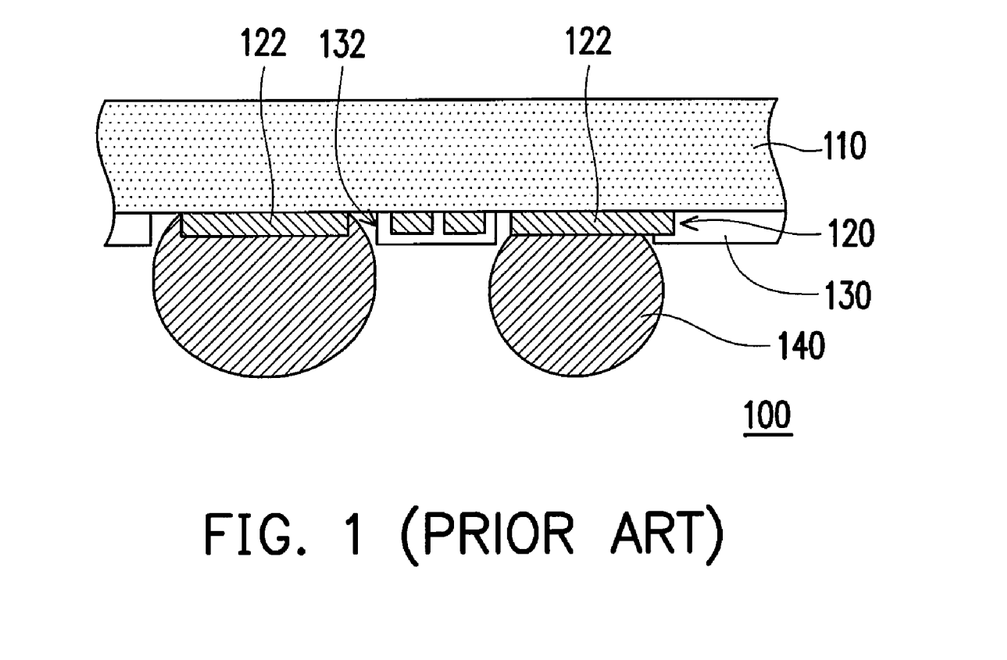
FIG. 1 is a schematic cross-sectional view of a conventional circuit board.

Please refer to FIG. 1 which is a schematic cross-sectional view of a conventional circuit board. A conventional circuit board 100 includes a dielectric layer 110, a circuit layer 120, a patterned solder mask layer 130 and a plurality of solder balls 140. The circuit layer 120 having a plurality of pads 122 is disposed on the dielectric layer 110. The patterned solder mask layer 130 is disposed on the dielectric layer 110 to cover a portion of the circuit layer 120. The patterned solder mask layer 130 has a plurality of openings 132 to expose the pads 122, respectively. In addition, the solder balls 140 are disposed on and electrically connected to the pads 122, respectively.

However, during the fabrication of the conventional circuit board 100, the openings 132 may not be precisely aimed at the pads 122 respectively when the patterned solder mask layer 130 is formed. Thereby, the patterned solder mask 130 may overly cover a part of the pads 122 (for example, the right pad 122 depicted in FIG. 1). Accordingly, as the solder balls 140 are formed on the pads 122 respectively, an area of junctions between parts of the solder balls 140 (for example, the right solder ball 140 depicted in FIG. 1) and the corresponding pads 122 (for example, the right pad 122 depicted in FIG. 1) is reduced, such that the reliability of bonding between the parts of the solder balls 140 and the corresponding pads 122 is decreased.

SUMMARY OF THE INVENTION

The present invention is directed to a circuit board having a conductive joint column disposed on a pad, and the enhanced reliability of bonding between another component and the conductive joint column will be provided.

The present invention is directed to a method of fabricating a circuit board having a conductive joint column disposed on a pad, and the enhanced reliability of bonding between another component and the conductive joint column will be provided.

The present invention provides a circuit board including a dielectric layer, a circuit layer, at least a conductive joint column, and a solder mask layer. The circuit layer having at least a pad is in contact with the dielectric layer. The conductive joint column is disposed on the pad. The solder mask layer is disposed on the dielectric layer and covers the circuit layer. The solder mask layer is in contact with the conductive joint column, and the conductive joint column passes through the solder mask layer. A height of the conductive joint column is larger than a thickness of the solder mask layer.

According to an embodiment of the present invention, a ratio of dividing the height of the conductive joint column by the thickness of the solder mask layer is greater than or equal to 3 and smaller than or equal to 5.

According to an embodiment of the present invention, the circuit board further includes at least an electrical connection element disposed on the solder mask layer and connected to the conductive joint column. The electrical connection element encapsulates a portion of the conductive joint column. In addition, the electrical connection element may be a solder ball.

According to an embodiment of the present invention, the circuit layer may be embedded into the dielectric layer.

According to an embodiment of the present invention, the circuit board further includes at least a through hole penetrating the dielectric layer and exposing the pad.

The present invention further provides a method of fabricating a circuit board. The method includes the following steps. First, a patterned metal board is provided. The patterned metal board includes a patterned circuit having at least a pad. Next, a dielectric layer is formed on the patterned metal board to cover the patterned circuit. Thereafter, a processing treatment is preformed on a surface of the patterned metal board in which the surface is opposite to the patterned circuit, such that at least a conductive joint column disposed on the pad and a circuit layer having the patterned circuit are formed. Afterwards, a solder mask layer is formed on the dielectric layer to cover the circuit layer, such that the solder mask layer is in contact with the conductive joint column, the conductive joint column passes through the solder mask layer, and a height of the conductive joint column exceeds a thickness of the solder mask layer.

According to an embodiment of the present invention, a ratio of dividing the height of the conductive joint column by the thickness of the solder mask layer is greater than or equal to 3 and smaller than or equal to 5.

According to an embodiment of the present invention, the method of fabricating the circuit board further includes forming at least an electrical connection element on the solder mask layer, such that the electrical connection element is connected to the conductive joint column and encapsulates a portion of the conductive joint column. In addition, the method of forming the electrical connection element on the solder mask layer includes forming a solder ball on the solder mask layer.

According to an embodiment of the present invention, the dielectric layer is formed on the patterned metal board to cover the patterned circuit, such that the patterned circuit is embedded into the dielectric layer.

According to an embodiment of the present invention, the method of fabricating the circuit board further includes forming at least a through hole penetrating the dielectric layer and exposing the pad.

Since the conductive joint column passes through the solder layer and extends outwards, the electrical connection element formed on the solder mask layer and electrically connected to the conductive joint column may encapsulate the conductive joint column, such that the enhanced reliability of bonding between the electrical connection element and the conductive joint column will be provided.

In order to make the aforementioned and other objects, features and advantages of the present invention more comprehensible, several embodiments accompanied with figures are described in detail below.

DESCRIPTION OF EMBODIMENTS

Figure 2:
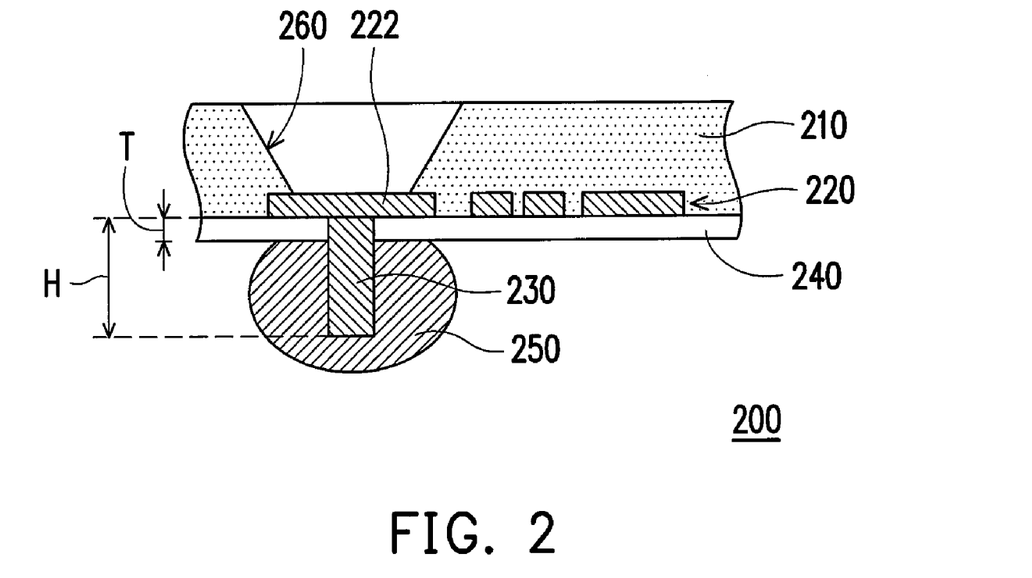
FIG. 2 is a schematic cross-sectional view of a circuit board according to an embodiment of the present invention.

Please refer to FIG. 2 which is a schematic cross-sectional view of a circuit board according to an embodiment of the present invention. A circuit board 200 of the present embodiment includes a dielectric layer 210, a circuit layer 220, at least a conductive joint column 230 (only one is schematically shown in FIG. 2), and a solder mask layer 240.

The circuit layer 220 is in contact with the dielectric layer 210 and has at least a pad 222 (only one is schematically shown in FIG. 2). The conductive joint column 230 is disposed on the pad 222. The solder mask layer 240 is disposed on the dielectric layer 210 and covers the circuit layer 220. Moreover, the solder mask layer 240 is in contact with the conductive joint column 230, and the conductive joint column 230 passes through the solder mask layer 240. A height H of the conductive joint column 230 is larger than a thickness T of the solder mask layer 240. According to the present embodiment, a ratio of dividing the height H of the conductive joint column 230 by the thickness T of the solder mask layer 240 is greater than or equal to 3 and smaller than or equal to 5.

In addition, the solder mask layer 240 is utilized to protect the circuit layer 220, such that the circuit layer 220 can be prevented from suffering damage caused by an external force. The solder mask layer 240 may also preclude the circuit layer 220 from being adversely affected by solder materials which cause undesirable bridging or short-circuit when at least an electrical connection element 250 (indicated hereinafter) is subsequently formed on the conductive joint column 230.

In the present embodiment, the circuit board 200 further includes at least one electrical connection element 250 (only one is schematically shown in FIG. 2). The electrical connection element 250 is disposed on the solder mask layer 240, connected to the conductive joint column 230, and encapsulates a portion of the conductive joint column 230. Further, the electrical connection element 250 may be a solder ball, and a material thereof includes tin. On the other hand, the circuit layer 220 of the present embodiment may be embedded into the dielectric layer 210, and the circuit board 200 further includes at least a through hole 260 penetrating the dielectric layer 210 and exposing the pad 222. In FIG. 2, only one through hole 260 is schematically illustrated.

A method of fabricating the circuit board 200 according to the present embodiment is elaborated hereinafter. FIGS. 3A through 3E are schematic cross-sectional views illustrating the method of fabricating the circuit board depicted in FIG. 2. The method of fabricating the circuit board 200 according to the present embodiment includes the following steps. First, referring to FIG. 3A, the patterned metal board B is provided. The patterned metal board B includes a patterned circuit P having the pad 222.

Figure 3A:
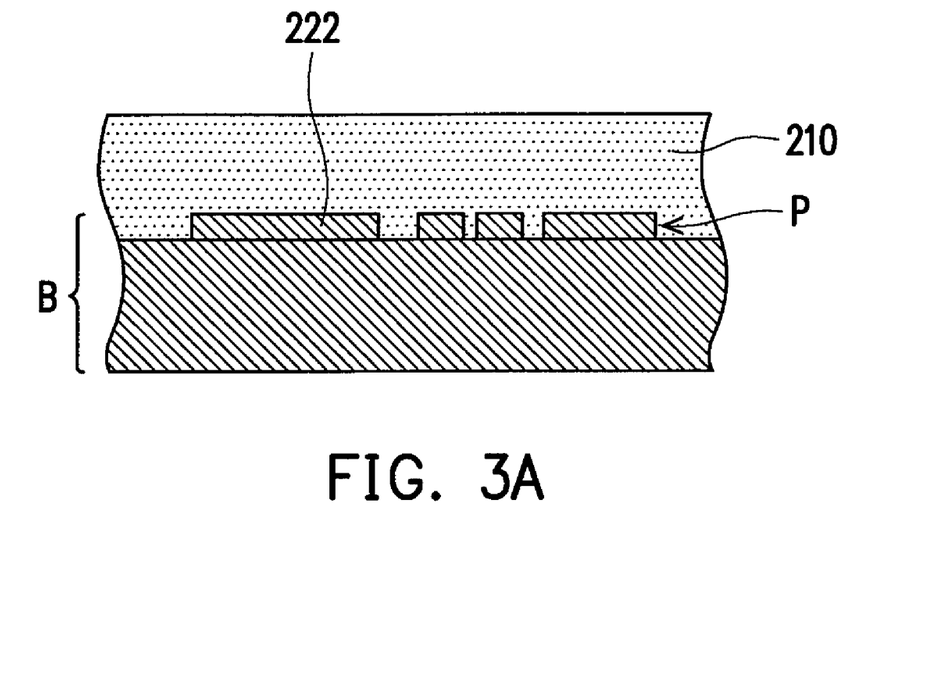
FIGS. 3A through 3E are schematic cross-sectional views illustrating a method of fabricating the circuit board depicted in FIG. 2.

Next, referring to FIG. 3A, the dielectric layer 210 is formed on the patterned metal board B to cover the patterned circuit P. In the present embodiment, the method of forming the dielectric layer 210 on the patterned metal board B includes laminating the dielectric layer 210 and the patterned metal board B or forming the dielectric layer 210 on the patterned metal board B through printing. Furthermore, the patterned circuit P of the present embodiment may be embedded into the dielectric layer 210.

Figure 3B:
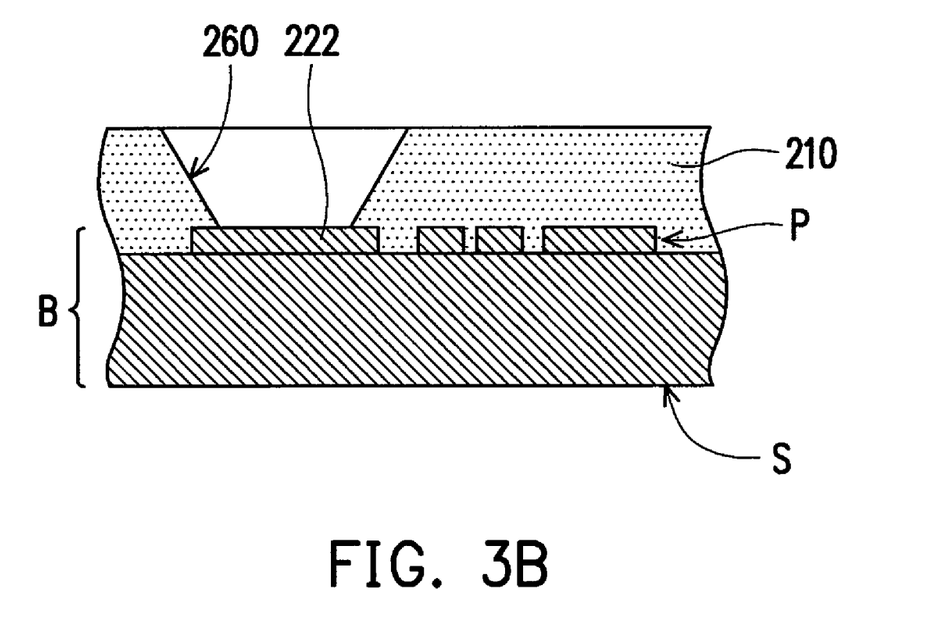

Thereafter, referring to FIG. 3B, the through hole 260 may be formed by performing a laser drilling or a photolithography process according to the present embodiment, such that the through hole 260 penetrates the dielectric layer 210 and exposes the pad 222.

Figure 3C:
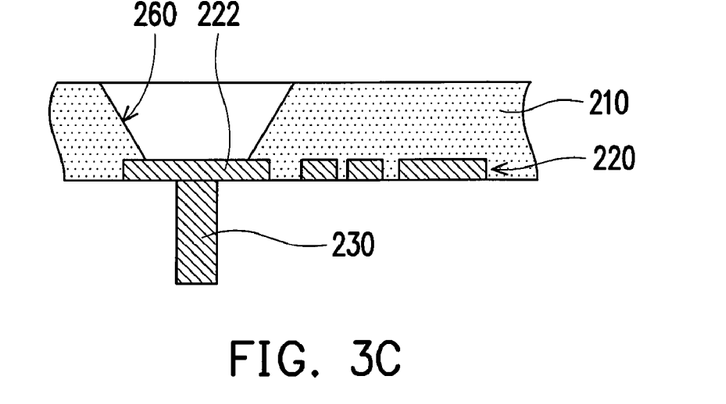

After that, referring to FIGS. 3B and 3C, a processing treatment is performed on a surface S of the patterned metal board B in which the surface S is opposite to the patterned circuit P, such that the conductive joint column 230 disposed on the pad 222 and the circuit layer 220 having the patterned circuit P are formed. It should be noted that the processing treatment in the present embodiment may be performed in two manners.

Figure 4A:
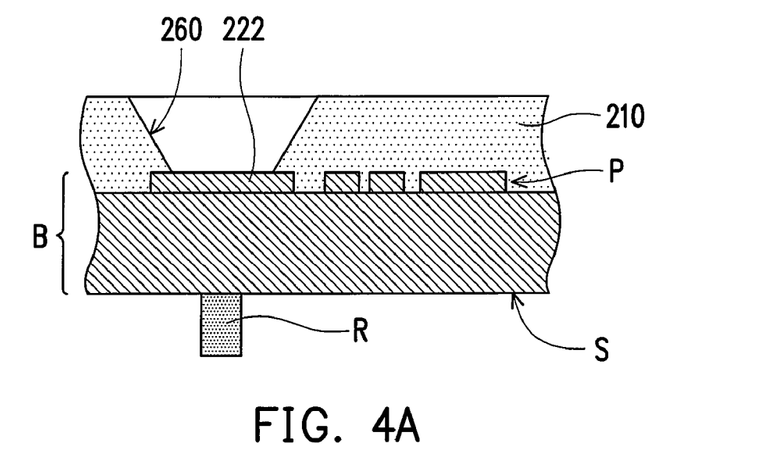
FIGS. 4A through 4C are schematic cross-sectional views illustrating a processing treatment performed on a patterned metal board depicted in FIG. 3C in a first manner.
Figure 4B:
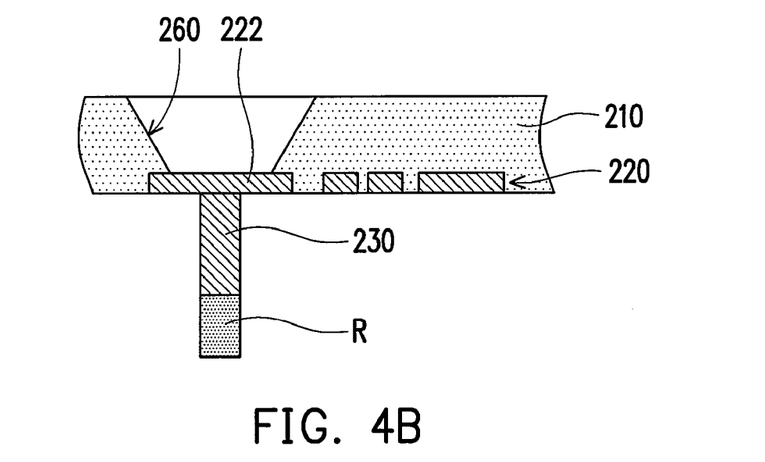
Figure 4C:
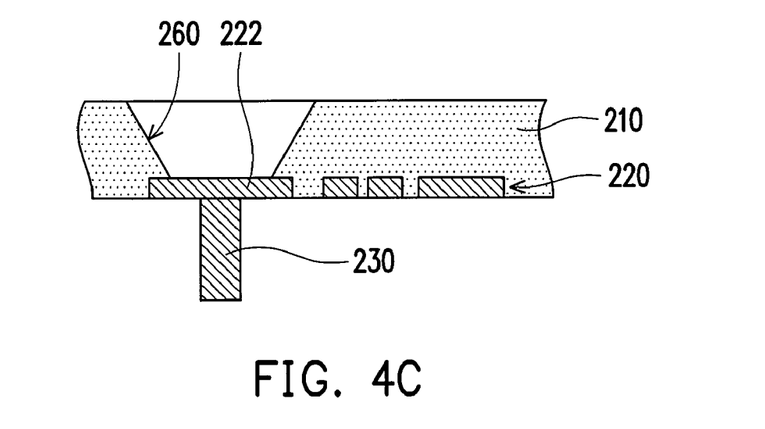

FIGS. 4A through 4C are schematic cross-sectional views illustrating the processing treatment performed on the patterned metal board depicted in FIG. 3C in a first manner. The processing treatment performed in the first manner includes the following steps. First, referring to FIG. 4A, a patterned photoresist layer R is formed on the surface S of the patterned metal board B and is corresponding to the pad 222. Next, referring to FIGS. 4A and 4B, a portion of the patterned metal board B exposed by the patterned photoresist layer R is removed by etching, so as to form the circuit layer 220 and the conductive joint column 230. After that, referring to FIGS. 4B and 4C, the patterned photoresist layer R is removed.

Figure 5A:
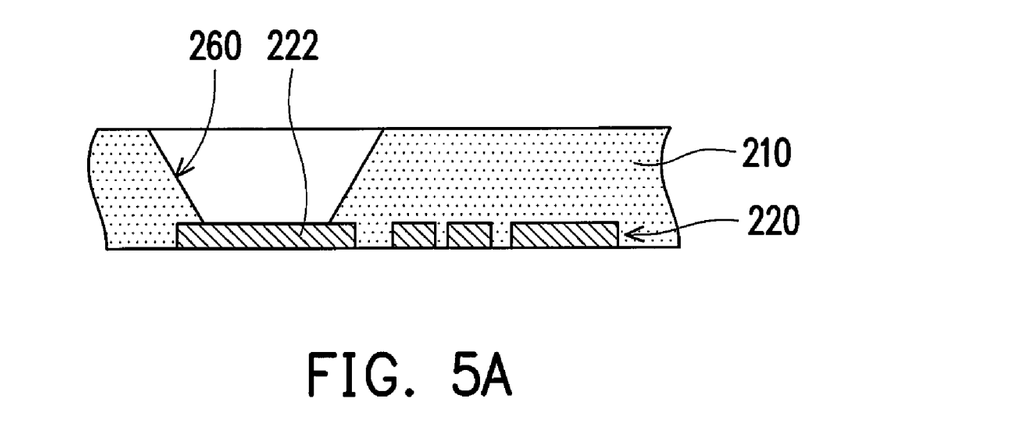
FIGS. 5A through 5D are schematic cross-sectional views illustrating the processing treatment performed on the patterned metal board depicted in FIG. 3C in a second manner.
Figure 5B:
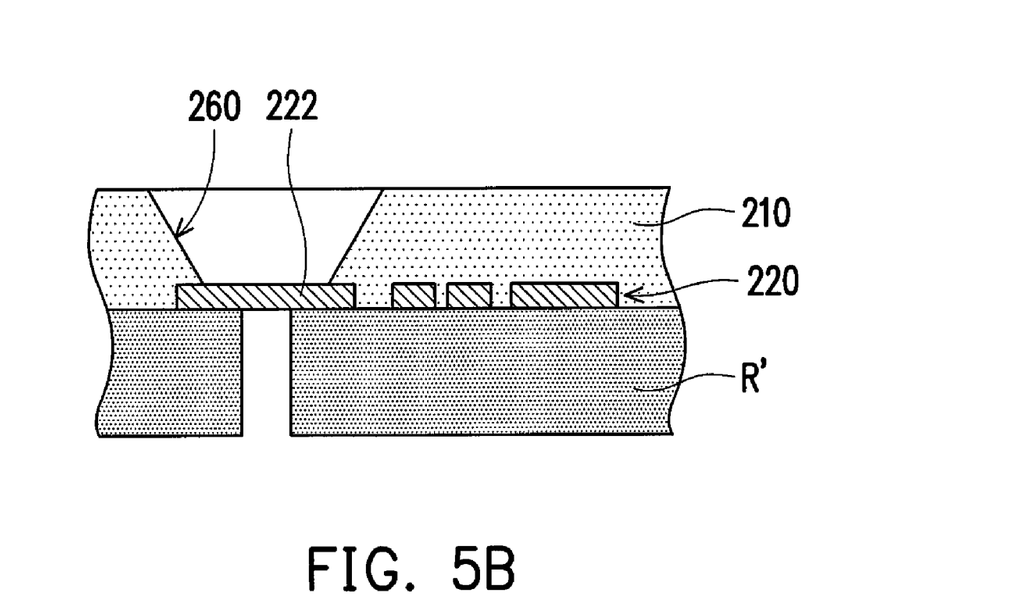
Figure 5C:
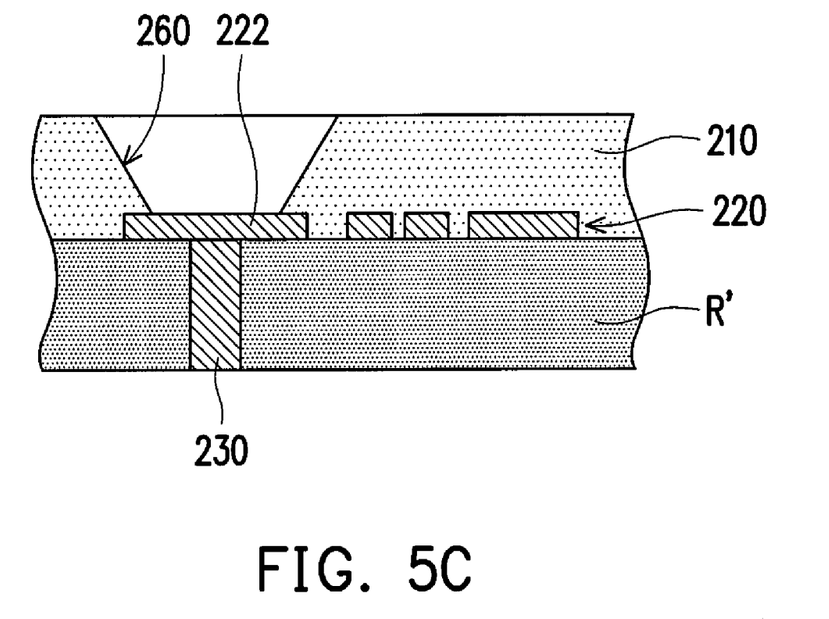
Figure 5D:
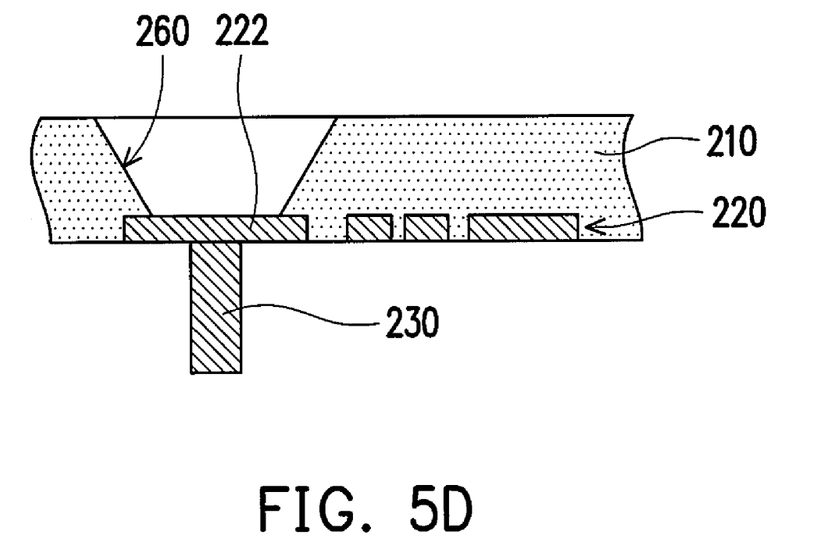

FIGS. 5A through 5D are schematic cross-sectional views illustrating the processing treatment performed on the patterned metal board depicted in FIG. 3C in a second manner. The processing treatment performed in the second manner includes the following steps. First, referring to FIG. 5A, a portion of the patterned metal board B is removed to form the circuit board 220. Thereafter, referring to FIG. 5B, a patterned photoresist layer R' is formed on the circuit layer 220, and the patterned photoresist layer R' exposes the pad 222. After that, as shown in FIG. 5C, the conductive joint column 230 is formed on the pad 222 by performing an electroplating process, a sputtering process, a vapor deposition process or a filling method. Referring to FIGS. 5C and 5D, the patterned photoresist layer R' is then removed.

Figure 3D:
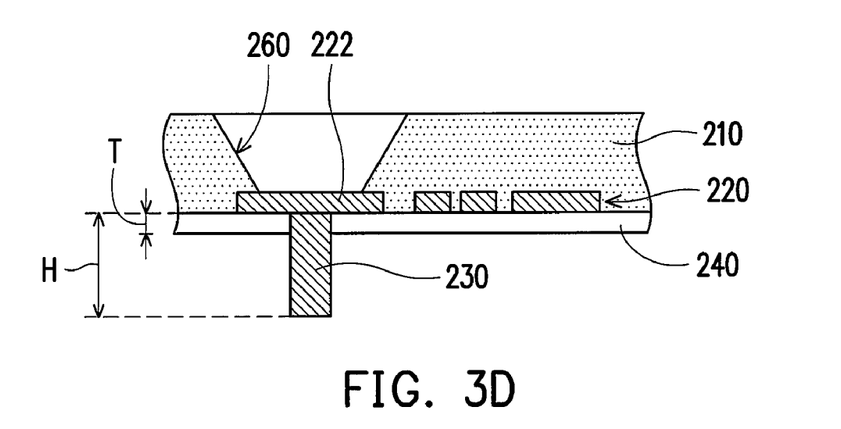

Please refer to FIG. 3D. After the circuit layer 220 and the conductive joint column 230 depicted in FIG. 3C are formed, the solder mask layer 240 is formed on the dielectric layer 210 to cover the circuit layer 220, such that the solder mask layer 240 is in contact with the conductive joint column 230, and the conductive joint column 230 passes through the solder mask layer 240. The height H of the conductive joint column 230 exceeds the thickness T of the solder mask layer 240. According to the present embodiment, a ratio of dividing the height H of the conductive joint column 230 by the thickness T of the solder mask layer 240 is greater than or equal to 3 and smaller than or equal to 5.

Figure 3E:
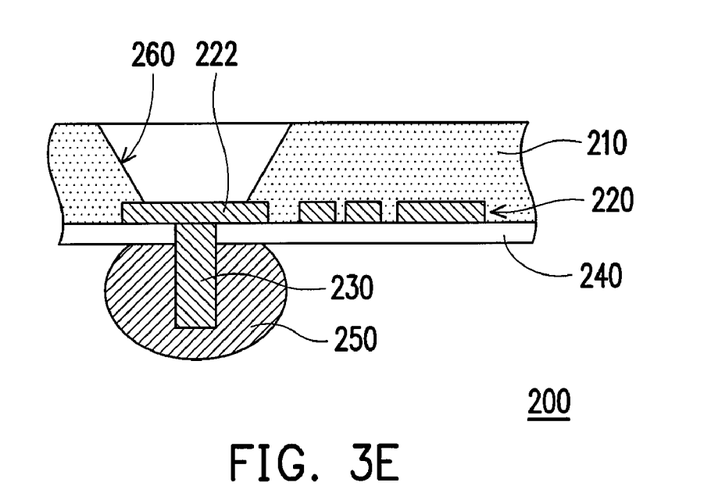

After that, referring to FIG. 3E, the electrical connection element 250 (e.g. the solder ball) may be formed on the solder mask layer 240, such that the electrical connection element 250 is connected to the conductive joint column 230 and encapsulates a portion of the conductive joint column 230.

Figure 6:
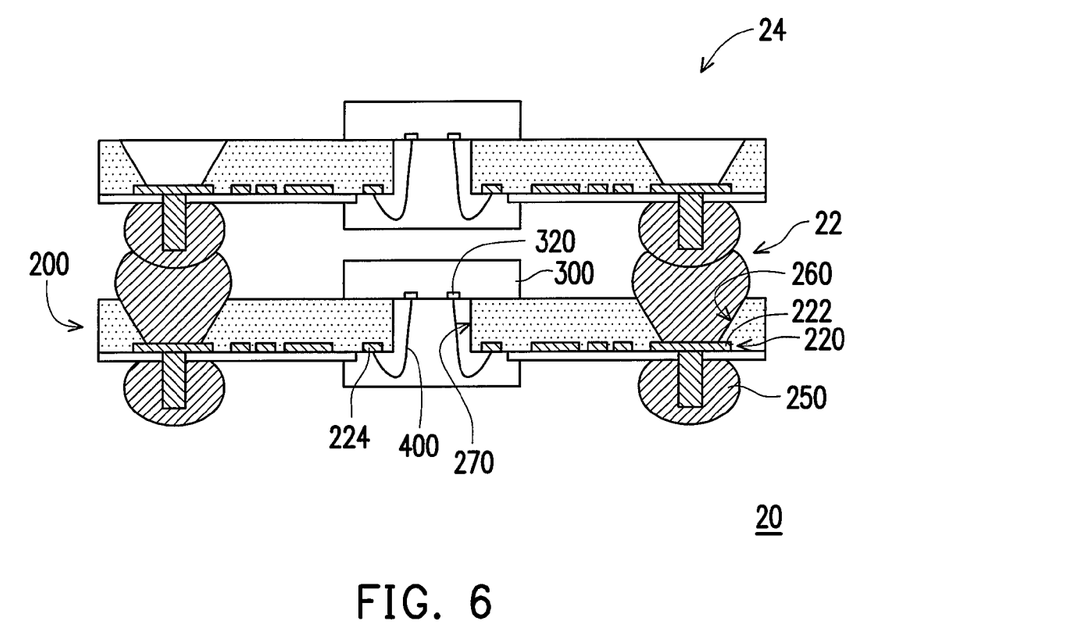
FIG. 6 is a schematic cross-sectional view illustrating an application of the circuit board depicted in FIG. 2 to a stacked chip package.

Please refer to FIG. 6 which is a schematic cross-sectional view illustrating an application of the circuit board depicted in FIG. 2 to a stacked chip package. A stacked chip package 20 includes two chip package units 22 and 24. A chip 300 of the chip package unit 22 is disposed on the circuit board 200. An aperture 270 of the circuit board 200 exposes a plurality of pads 320 of the chip 300. The pads 320 are electrically connected to a plurality of pads 224 of the circuit layer 220 through a plurality of bonding wires 400 passing through the aperture 270. The electrical connection element 250 may be electrically connected to another electronic device (such as a motherboard which is not shown in the drawings). Additionally, the chip package unit 24 is disposed on the chip package unit 22 and is electrically connected to the pads 222 exposed by the through holes 260. It should be noted that the circuit board 200 may be applied to other forms of the chip packages. Moreover, the profile of the circuit board 200 may vary based on designers' demands. Thus, the present embodiment is exemplary but is not intended to limit the scope of the present invention.

In light of the foregoing, since the conductive joint column passes through the solder mask layer and extends outwards, the electrical connection element formed on the solder mask layer and electrically connected to the conductive joint column may encapsulate the conductive joint column, such that the enhanced reliability of bonding between the electrical connection element and the conductive joint column will be provided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board, comprising:
    a dielectric layer;
    a circuit layer in contact with the dielectric layer, wherein the circuit layer has at least a pad, and the dielectric layer has at least a through hole exposing the pad;
    at least a conductive joint column disposed on the pad; and
    a solder mask layer disposed on the dielectric layer and covering the circuit layer, wherein the solder mask layer is in contact with the conductive joint column, the conductive joint column passes through the solder mask layer, and a height of the conductive joint column is larger than a thickness of the solder mask layer; and
    at least an electrical connection element encapsulates a top portion of the conductive joint column and separates from the pad by the solder mask layer to form a solder ball having a bottom area in diameter smaller than a height of the solder ball,
    wherein the circuit layer is embedded into the dielectric layer.

2. The circuit board as claimed in claim 1, wherein a ratio of dividing the height of the conductive joint column by the thickness of the solder mask layer is greater than or equal to 3 and smaller than or equal to 5.

3. The circuit board as claimed in claim 1, wherein the electrical connection element is made of tin.

4. The circuit board as claimed in claim 1, wherein the dielectric layer has an aperture for exposing a chip, the chip electrically connects to the circuit layer by a plurality of bonding wires passing through the aperture.

5. The circuit board as claimed in claim 1, wherein the conductive joint column is formed on the pad by performing an electroplating process, a sputtering process, a vapor deposition process or a filling method.

6. The circuit board as claimed in claim 1, wherein the through hole is formed by performing a laser drilling or a photolithography process.

* * * * *